United States Patent [19]

DeBock

[11] 4,423,384

[45] Dec. 27, 1983

[54] ASYNCHRONOUS MULTI-PORT ARBITER

[75] Inventor: Richard M. DeBock, Phoenix, Ariz.

[73] Assignee: Motorola, Inc., Schaumburg, Ill.

[21] Appl. No.: 333,151

[22] Filed: Dec. 21, 1981

[51] Int. Cl.³ .............................................. H03K 5/26
[52] U.S. Cl. .................................... 328/152; 307/243;
340/825.51
[58] Field of Search ............... 307/443, 464, 470, 480,
307/243, 265, 269, 272 R, 592, 518; 328/109,
110, 117, 152, 154, 104; 340/825.5, 825.1,
825.03, 825.51

[56] References Cited

U.S. PATENT DOCUMENTS

| | | | |
|---|---|---|---|
| 4,199,661 | 4/1980 | White et al. | 340/825.5 X |
| 4,249,093 | 2/1981 | Henig | 340/825.5 X |
| 4,314,164 | 2/1982 | Tin et al. | 328/154 X |
| 4,314,233 | 2/1982 | Clark | 340/825.03 X |
| 4,339,808 | 8/1982 | North | 328/154 X |
| 4,375,639 | 3/1983 | Johnson, Jr. | 340/825.5 |

FOREIGN PATENT DOCUMENTS 56-32855  4/1981  Japan ................................ 340/825.5

OTHER PUBLICATIONS

Sterling, "Modular Switch Array Includes Priority Encoder", *Electronics,* Aug. 1977, pp. 114-115.

*Primary Examiner*—Stanley D. Miller
*Assistant Examiner*—David R. Hudspeth
*Attorney, Agent, or Firm*—Vincent B. Ingrassia

[57] ABSTRACT

The arbitration circuit for granting control of a shared resource to one of a plurality of ports based upon a predetermined scheme of priority includes a plurality of input flip-flops for receiving request signals from the plurality of ports. If any of the ports have requested control, the input flip-flops are latched. A priority signal is generated indicating which of the ports has priority. This is accomplished by a second plurality of delay type flip-flops which are then latched. Additional circuitry generates a resource grant signal for transmission to a requesting port. The input flip-flops are then unlatched to permit the request signals to pass through. The second plurality of delay type flip-flops are unlatched subsequent to termination of the input request signal.

8 Claims, 2 Drawing Figures

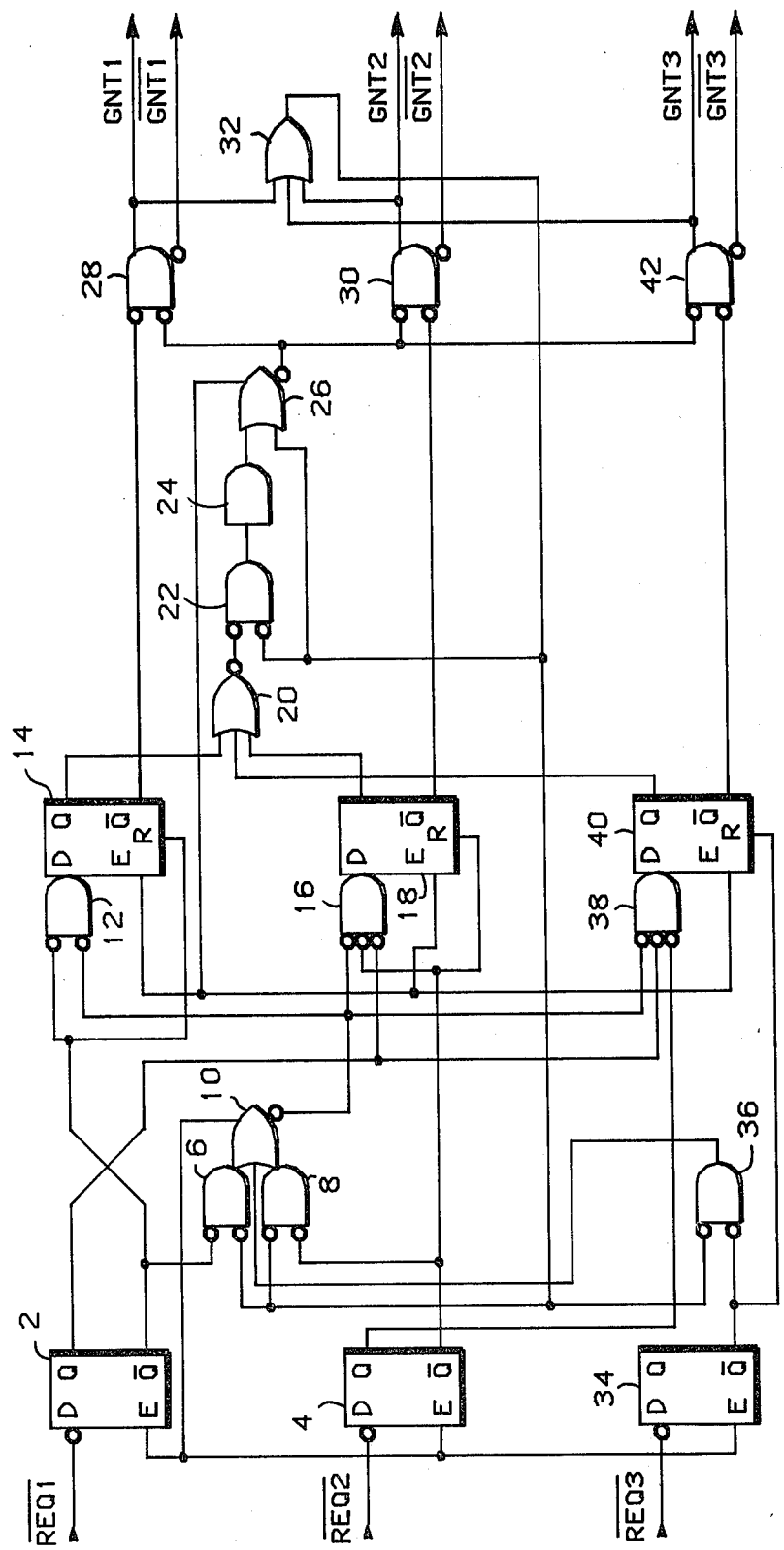

ASYNCHRONOUS MULTI-PORT ARBITER

BACKGROUND OF THE INVENTION

1. Field of the Invention

This invention relates generally to interface circuits and, more particularly, to a logic circuit for arbitrating among at least two requests for access to a common resource on the basis of priority.

2. Description of the Prior Art

In many computer systems, certain system resources are shared with some or all of the intelligent devices in the system. The shared resources may comprise memory or peripheral units. When a shared resource is accessed over a common system bus, a system bus arbiter usually determines which intelligent device will have access to the bus at any one time. Since the system bus is itself a shared resource, any resource connected to the system bus automatically becomes shared.

In some systems, for example mono-board computers, two separate busses must access a shared resource; i.e. the on-board private bus and the common system bus. The on-board bus should not be affected by events occurring on the common system bus, and on-board accesses to an on-board shared resource should not be effected by events occurring on the common system bus unless the resource is requested by both the common system bus and the on-board bus. Accesses to the shared on-board resource must be arbitrated by something other than the system bus arbitrator since the requests come from more than one source.

In the case of a dynamic random access memory (RAM), one port or avenue of access would comprise a bus while a second port or avenue of access may be coupled to the system's refresh circuitry. Additional avenues or ports may lead to additional busses. All such configurations require some form of arbitration logic to select which port will gain control of the resource.

In a synchronous system, a master clock signal generally determines when data transfers can occur, and the arbitration process is synchronized to this clock. In asynchronous systems, data transfers are not referenced to a master clock.

Unfortunately, prior art arbiters may impose a dead time between release of the shared resource by one user and arbitration of the next request.

SUMMARY OF THE INVENTION

It is an object to the present invention to provide an improved arbitration circuit which grants control of a common resource to one of a number of requestors based upon a predetermined scheme of priority.

It is a further object of the present invention to provide an improved arbiter circuit which will terminate a grant to a first user and immediately thereafter begin arbitrating among new requests.

It is a still further object to the present invention to provide an improved arbiter circuit which is easily expandable to include additional users without sacrificing performance or speed.

According to a broad aspect of the invention there is provided an arbitration circuit for granting control of a shared resource to one of a plurality of ports based upon a predetermined scheme of priority, comprising: input means for receiving request signals from said plurality of ports; first means for indicating if one of said plurality of ports has been granted control of said resource; second means coupled to said input means and to said first means for latching said request signals in said input means if none of said plurality of ports has control of said resource; third means coupled to said input means and to said second means for generating a priority signal indicative of which port has priority; fourth means coupled to said third means and to said first means for latching the state of said third means; and fifth means coupled to said third and fourth means and having outputs coupled to said first means for generating a resource grant signal for transmission to a requesting port, said second means unlatching said input means when said resource grant signal is generated to permit said request signals to pass through said input means, and said fourth means being responsive to the termination of said priority signal for unlatching said third means.

The above another objects, features and advantages of the present invention will be more clearly understood from the following detailed description taken in conjunction with the accompanying drawings, in which:

BRIEF DESCRIPTION OF THE DRAWINGS

FIG. 2 is a logic diagram illustrating how the arbitration circuit shown in FIG. 1 can be expanded to accommodate additional ports.

DESCRIPTION OF THE PREFERRED EMBODIMENT

Figure 1:
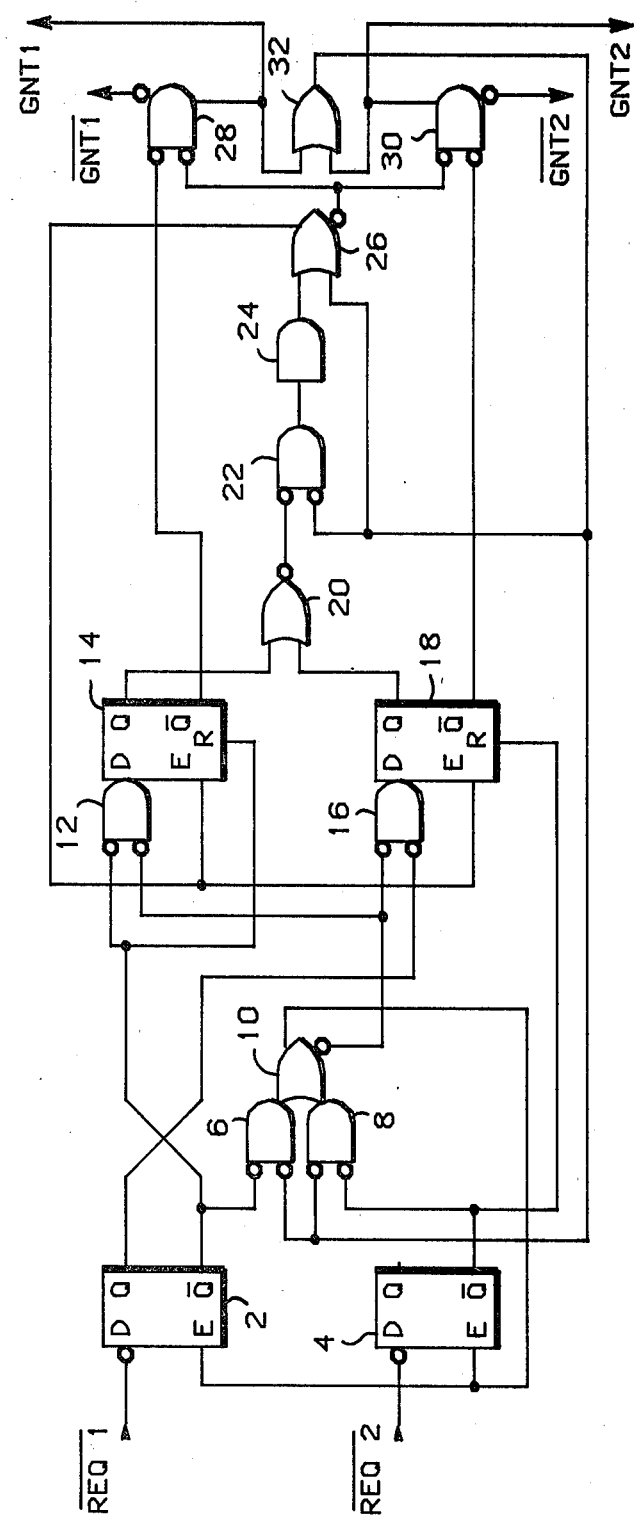
FIG. 1 is a logic diagram of an arbitration circuit according to the present invention for arbitrating among requests from first and second ports.

Before embarking on a discussion of the circuit shown in FIG. 1, it may be helpful to first define the input and output signals supplied to and generated by the circuit.

$\overline{REQ1}$ when low indicates that port 1 is requesting access to the shared resource. When at a high logic level, this signal indicates that port 1 does not require access. $\overline{REQ2}$ when low indicates that port 2 is requesting access to the resource. GNT1 when high indicates that port 1 has been granted access to the shared resource. When low, GNT1 indicates that port 1 has not been granted access. GNT2, when high, indicates that port 2 has been granted access to the shared resource. $\overline{GNT1}$ and $\overline{GNT2}$ are merely the complements of GNT1 and GNT2 respectively.

Two types of latches are used in the circuit shown in FIG. 1. Latches 2 and 4 are transparent latches, and latches 14 and 18 are resettable transparent latches. The truth table for transparent latches 2 and 4 is shown in Table 1, and the truth table for resettable transparent latches 14 and 18 is shown in Table 2 where L represents a low signal level, H represents a high signal level, X represents either a high or low signal level, and $Q_D$ represents the signal level of the D input one set-up time before the signal appearing at the E input goes high.

TABLE 1

| INPUTS | | OUTPUTS | | OPERATING |
|---|---|---|---|---|
| D | E | Q | $\overline{Q}$ | MODE |
| L | L | L | H | TRANSPARENT |
| H | L | H | L | TRANSPARENT |
| X | H | $Q_D$ | $\overline{Q_D}$ | LATCHED |

TABLE 2

| INPUTS | | | OUTPUTS | | OPERATING |
|---|---|---|---|---|---|
| R | D | E | Q | $\overline{Q}$ | MODE |
| H | X | X | L | H | RESET |
| L | L | L | L | H | TRANSPARENT |
| L | H | L | H | L | TRANSPARENT |
| L | X | H | $Q_D$ | $\overline{Q_D}$ | LATCHED |

Request signals $\overline{REQ1}$ and $\overline{REQ2}$ are applied, after inversion, to the D inputs of latches 2 and 4. Latch 2 has a Q output which is coupled to a first input of NOR gate 16 and a $\overline{Q}$ output which is coupled to a first input of NOR gate 6, a first input of NOR gate 12, and to the reset input of resettable transparent latch 14. Transparent latch 4 has a $\overline{Q}$ output which is coupled to a first input of NOR gate 8 and to the reset input of resettable transparent latch 18. OR gate 10 has first and second inputs coupled to the outputs of NOR gates 6 and 8 respectively, has a non-inverting output coupled to the E inputs of transparent latches 2 and 4, and has an inverting output which is coupled to a second input of NOR gate 12 and to a second input of NOR gate 16.

Resettable transparent latch 14 has a Q output coupled to a first input of NOR gate 20 and a $\overline{Q}$ output coupled to a first input of NOR gate 28. Resettable latch 18 has a Q output coupled to a second input of NOR gate 20 and a $\overline{Q}$ output coupled to a first input of NOR gate 30. The output of NOR gate 20 is coupled to a first input of NOR gate 22 which in turn has an output passing through delay buffer 24 and into a first input of OR gate 26. OR gate 26 has a non-inverting output coupled to the E inputs of resettable transparent latches 14 and 18 and has an inverting output coupled to second inputs of NOR gates 28 and 30. The grant signals GNT1 and GNT2 appear at the non-inverting outputs of NOR gates 28 and 30 respectively while $\overline{GNT1}$ and $\overline{GNT2}$ appear at the inverting outputs of NOR gates 28 and 30 respectively. OR gate 32 has a first input coupled to GNT1 and second input coupled to GNT2. The output of OR gate 32 is applied to a second input of NOR gate 22, to a second input of OR gate 26, and to second inputs of NOR gates 6 and 8.

When the shared resource is not being requested, $\overline{REQ2}$ and $\overline{REQ1}$ will remain at a high logic level. If, for example, the user of highest priority were requesting access, $\overline{REQ1}$ would go low. As a result, the Q output of latch 2 would go high and its $\overline{Q}$ output would go low. Since the output of OR gate 32 is low (no grants have been generated) and since the $\overline{Q}$ output of latch 2 is low, the non-inverting output of OR gate 10 will go high latching the state of $\overline{REQ1}$ and $\overline{REQ2}$ in latches 2 and 4 respectively.

The inverting output of OR gate 10 is coupled to a first input of NOR gate 12, the second input of which is coupled to the $\overline{Q}$ output of latch 2. Thus, the D input of latch 14 will go high. Since the Q output of latch 2 is high, the D input of latch 18 which is coupled to the output of NOR gate 16 remains low. The Q output of latch 14 goes high and propagates through NOR gates 20 and 22 causing the output of NOR gate 22 to go high. The output of NOR gate 22 is sufficiently delayed in buffer 24 so as to permit latches 2 and 4 to settle.

With a high at the output of buffer 24, the non-inverting output of OR gate 26 goes high which causes latches 14 and 18 to become latched. The inverting output of OR gate 26 goes low and is applied to inputs of NOR gates 28 and 30. Since the $\overline{Q}$ output of latch 14 is low and the Q output of latch 18 is high, the non-inverting output of NOR gate 28 (GNT1) goes high while $\overline{GNT1}$ goes low. The non-inverting output of NOR gate 30 (GNT2) remains low. Since GNT1 is now high, the output of OR gate 32 goes high causing latches 14 and 18 to remain latched via OR gate 26. The output of NOR gate 22 will go low so as to clear out buffer 24. The non-inverting output of OR gate 10 will go low permitting $\overline{REQ1}$ and $\overline{REQ2}$ to pass through latches 2 and 4 respectively.

When port 1 no longer requires the resource, $\overline{REQ1}$ will go high causing the $\overline{Q}$ output of latch 2 to go high. This will result in resetting latch 14. Thus, the $\overline{Q}$ output of latch 14 will go high causing $\overline{GNT1}$ at the output of NOR gate 28 to go low. The output of OR gate 32 will again go low permitting latches 2 and 4 to latch the next request via NOR gates 6 or 8 and OR gate 10. Latches 14 and 18 unlatch via OR gate 26 if the output of delay buffer 24 is low. If the output of delay buffer 24 is still high when the output of OR gate 32 goes low, then latches 14 and 18 will remain latched until the output of delay buffer 24 goes low.

A similar process takes place if $\overline{REQ2}$ goes low while $\overline{REQ1}$ remains high. The $\overline{Q}$ output of latch 4 will go low causing the non-inverting output of OR gate 10 to go high. As was the case before, this latches the state of $\overline{REQ1}$ and $\overline{REQ2}$ in latches 2 and 4.

As was the case previously, the inverting output of OR gate 10 goes low and is applied to a first input of NOR gate 16. The second input of NOR gate 16 is coupled to the Q output of latch 2 which is low. This causes a high to appear at the D input of latch 18. The D input of 14 remains low. The Q output of latch 18 goes high and propagates through gates 20 and 22 causing the output of gate 22 to go high. As was the case previously, the output of NOR gate 22 is delayed in delay buffer 24 so as to permit latches 2 and 4 to settle. Non-inverting output of OR gate 26 goes high causing latches 14 and 18 to become latched. The inverting output of OR gate 26 goes low enabling GNT2 at the non-inverting output of NOR gate 30. The output of OR gate 32 again goes high causing latches 14 and 18 to remain latched via OR gate 26. The output of NOR gate 22 goes low and the non-inverting output of OR gate 10 goes low allowing the state of request $\overline{REQ1}$ and $\overline{REQ2}$ to pass through latches 2 and 4.

When the second port no longer needs the resource, $\overline{REQ2}$ goes high. The $\overline{Q}$ output of latch 4 goes high causing latch 18 to reset. When the $\overline{Q}$ output of latch 18 goes high, $\overline{GNT2}$ goes low at the non-inverting output of NOR gate 30. The output of OR gate 32 will again go low allowing latches 2 and 4 to latch the next request via gates 6, 8 and 10. Latches 14 and 18 unlatch via gate 26 if the output of delay buffer 24 is low. If the output of delay buffer 24 is still high when the output of OR gate 32 goes low, latches 14 and 18 will remain latched until the output of delay buffer 24 goes low.

FIG. 2 illustrates how the circuit of FIG. 1 may be expanded to accommodate requests from three users. Like elements have been denoted with like reference numerals. In the circuit shown in FIG. 2, the first user which generates request signal $\overline{REQ1}$ has highest priority while the third user which generates $\overline{REQ3}$ has the lowest priority. As can be seen, $\overline{REQ3}$ is applied to the D input of an additional flip-flop 34 whose $\overline{Q}$ output is coupled to a first input of an additional NOR gate 36 and to the reset input of an additional resettable transparent latch 40. The second input of NOR gate 36 is coupled to the output of OR gate 32. OR gate 10 is now a three input OR gate, the third input being coupled to the output of NOR gate 36. The Q output of latch 4 is now coupled to a first input of three input NOR gate 38. A second input of NOR gate 38 is coupled to the inverting output of OR gate 10, and the third input of NOR gate 38 is coupled to the Q output of latch 2. The D input of latch 40 is coupled to the output of NOR gate 38 and its E input is coupled to the non-inverting output of OR gate 26. NOR gate 16 has been converted to a three input NOR gate with the third input being coupled to the Q output of latch 4. NOR gate 20 is also now a three input NOR gate with the third input being coupled to the Q output of latch 40. The $\overline{Q}$ output of latch 40 is coupled to a first input of a new NOR gate 42. The second input of NOR gate 42 is coupled to the inverting output of OR gate 26. The grant signal to the third user (GNT3) appears at the non-inverting output of new NOR gate 42 while $\overline{GNT3}$ appears at its inverting output. OR gate 32 is now a three input OR gate with its third input coupled to GNT3. Thus, the output of OR gate 32 will go high if any one of GNT1, GNT2, or GNT3 is high. It should be obvious from this that the circuit may be expanded to accommodate any number of users by merely adding additional logic without sacrificing speed or performance.

The circuits described in FIGS. 1 and 2 are basically first come, first serve arbitration circuits. Any requests will initiate an arbitration sequence. If multiple requests occur simultaneously, the higher priority request will mask a request of lower priority. For example, in FIG. 1, $\overline{REQ1}$ will always override or mask $\overline{REQ2}$. The delay buffer gate 24 between NOR gate 22 and OR gate 26 provides sufficient settling delay for the input latches when a higher priority request occurs just as the input latches begin to latch.

The above description is given by way of example only. Changes in form and details may be made by one skilled in the art without departing from the scope of the invention as defined by the appended claims.

I claim:

1. An arbitration circuit for granting control of a shared resource to one of a plurality of ports based upon a predetermined scheme of priority, comprising:
   input means for receiving request signals from said plurality of ports;
   first means for indicating if one of said plurality of ports has been granted control of said resource;
   second means coupled to said input means and to said first means for latching said request signals in said input means if none of said plurality of ports has control of said resource;
   third means coupled to said input means and to said second means for generating a priority signal indicative of which port has priority;
   fourth means coupled to said third means and to said first means for latching the state of said third means; and
   fifth means coupled to said third and fourth means and having outputs coupled to said first means for generating a resource grant signal for transmission to a requesting port, said second means unlatching said input means when said resource grant signal is generated to permit said request signals to pass through said input means, and said fourth means being responsive to the termination of said priority signal for unlatching said third means.

2. An arbitration circuit according to claim 1 wherein said input means comprises a plurality of delay type flip-flops each having a delay input coupled to one of said plurality of request signals and each having a latching input coupled to the output of said second means.

3. An arbitration circuit according to claim 2 wherein said second means comprises logic means for generating a latching signal if none of said plurality of ports has been given control of said resource and at least one of said request signals has been received.

4. An arbitration circuit according to claim 3 wherein said logic means comprises:
   a plurality of NOR gates each having one input coupled to the output of said first means and a second input coupled to an output of one of said delay type flip-flops and each having an output; and
   an OR gate having a plurality of inputs each one coupled to the output of one of said plurality of NOR gates, said latching signal appearing at the output of said OR gate.

5. An arbitration circuit according to claim 3 wherein said third means comprises:
   a second plurality of delay type flip-flops each having a delay input and a latching input; and
   second logic means coupled to the delay inputs of said second plurality of flip-flops, said logic means generating a signal at the D input of the flip-flop corresponding to the highest priority request, the latching input of said flip-flops being coupled to the output of said fourth means such that only one of said flip-flops is set corresponding to the request of highest priority.

6. An arbitration circuit according to claim 5 wherein said fourth means comprises:
   means for detecting if one of said second plurality of flip-flops has been set and for generating a signal indicative thereof;
   means for delaying said signal by a predetermined amount; and
   means responsive to said delayed signal and to the generation of a grant signal for latching said second plurality of flip-flops.

7. An arbitration circuit according to claim 6 wherein said fifth means comprises a plurality of NOR gates each having a first input coupled to the output of said fourth means and each having a second input coupled to a different one of said second plurality of flip-flops for generating said grant signals.

8. An arbitration circuit according to claim 7 wherein said first means comprises an OR gate having a plurality of inputs each one coupled to a different one of said grant signal generating NOR gates.

* * * * *